United States Patent [19]
Fujisawa

[11] Patent Number: 5,642,120
[45] Date of Patent: Jun. 24, 1997

[54] ANTENNA DEVICE AND WIRELESS APPARATUS EMPLOYING THE SAME

[75] Inventor: Teruhiko Fujisawa, Suwa, Japan

[73] Assignee: Seiko Epson Corporation, Tokyo, Japan

[21] Appl. No.: 534,582

[22] Filed: Sep. 27, 1995

Related U.S. Application Data

[63] Continuation-in-part of Ser. No. 219,165, Mar. 28, 1994, abandoned.

[30] Foreign Application Priority Data

| Mar. 29, 1993 | [JP] | Japan | 5-70385 |
| Nov. 17, 1993 | [JP] | Japan | 5-288455 |
| Sep. 27, 1994 | [JP] | Japan | 6-231629 |

[51] Int. Cl.[6] .................................................. H01Q 1/24
[52] U.S. Cl. ........................... 343/702; 343/749; 343/767
[58] Field of Search ........................ 343/702, 700 MS, 343/745, 749, 767; 455/89, 90; H01Q 1/24

[56] References Cited

U.S. PATENT DOCUMENTS 5,079,559  1/1992  Umetsu et al. ..................... 343/702

FOREIGN PATENT DOCUMENTS

| 3-181208 | 7/1991 | Japan | 343/718 |
| 6-244618 | 9/1994 | Japan . | |
| 1-241927 | 9/1994 | Japan . | |

*Primary Examiner*—Michael C. Wimer
*Attorney, Agent, or Firm*—Oliff & Berridge

[57] ABSTRACT

An antenna device with superior antenna characteristics, including gain, for use with a compact portable wireless apparatus is disclosed. Compactness is achieved by using the space provided by the antenna device without harming antenna characteristics. The antenna device includes two conductive plates spaced from each other so as to define a gap between them. The conductive plates are short-circuited at one end portion of the conductive plates by a short-circuit plate. A capacitance element for tuning is connected at the opposite end portion of the conductive plates. The positions of feed points on the conductive plates connected to a circuit device of the wireless apparatus are different from the position at which the capacitance element is connected.

13 Claims, 6 Drawing Sheets

ANTENNA DEVICE AND WIRELESS APPARATUS EMPLOYING THE SAME

CROSS REFERENCE TO THE RELATED APPLICATION

This is a continuation-in-part of U.S. patent application Ser. No. 08/219,165 filed on Mar. 28, 1994 which is abandoned in favor of a Rule 62 continuation application Ser. No. 08/583,527 filed on Jan. 5, 1996.

BACKGROUND OF THE INVENTION

1. Field of the Invention

The present invention relates to portable wireless apparatuses and, more particularly, to antenna devices with similar antenna characteristics in different directions.

2. Description of the Related Art

Among antenna devices for use with wireless apparatuses antenna devices using two conductive plates placed substantially parallel to each other are known. In one example, disclosed in Japanese Laid-Open Patent Application No. 1-241927, two conductive plates are spaced from each other so as to define a gap between them, and the conductive plates are short-circuited by a short-circuit portion. A capacitance element is loaded at a feed point in order to form a loop antenna as shown in the circuit diagram. In another example, as disclosed in Japanese Laid-Open Patent Application No. 6-244618, a loop antenna is shown in which short-circuit conductors for short-circuiting the feed point and the two conductive plates are placed at nearly diagonal positions.

However, when such antenna devices are used with a portable wireless apparatus using a conventional loop antenna, the antenna dimensions must be small because of the portable feature desired, and it is difficult to obtain the necessary or sufficient antenna gain. Thus, it is difficult to maintain satisfactory sensitivity of the wireless apparatus.

SUMMARY OF THE INVENTION

The present invention is intended to solve the above-described problems. It is an object of the present invention to provide an antenna device that is simple in construction and capable of obtaining a larger antenna gain than was previously possible by using a slot antenna mode. It is another object of the present invention to provide a portable wireless apparatus that can be made compact by effectively using the space of the main body of the wireless apparatus without harming the antenna characteristics.

To achieve the above-described object, in accordance with a first aspect of the present invention, there is provided an antenna device and a portable wireless apparatus, including: two conductive plates placed substantially parallel to each other with a gap provided in between; a short-circuit plate for short-circuiting the conductive plates at the end portions of the conductive plates; and capacitance elements connected at end portions of the conductive plates on the side opposite the short-circuit plate, wherein the positions of the feed points of the two conductive plates are different from the position at which the capacitance element is connected.

According to another aspect of the present invention, there is provided an antenna device and a portable wireless apparatus, wherein the conductive plate is rectangular, and the short-circuit plate and the capacitance element are loaded at or near diagonally opposite positions of the conductive plate.

According to still another aspect of the present invention, there is provided an antenna device and a portable wireless apparatus, wherein a cutout portion is provided in a portion one of the conductive plates overlapping the portable wireless apparatus.

According to the portable wireless apparatus of the present invention, a loop antenna and a slot antenna are combined to improve antenna characteristics, and the characteristics of the antennas are added to each other in the most appropriate manner. Thus, it is possible to obtain a large antenna gain, and to reduce the electrical influence exerted upon the antenna characteristics by the circuit of the wireless apparatus.

Those features will be described below. In a conventional antenna device, two conductive plates and a short-circuit portion act as a loop antenna. The antenna device is provided with a capacitance element in order to tune to a desired frequency. The capacitance element is connected to the feed point of the antenna through a feed line, and the capacitance element and the feed point are electrically at the same position (level). When the position of the feed point of this antenna is shifted from the position of the capacitance element so that they are separated from each other on the conductive plate, it becomes possible for the slot portion formed in the periphery on the side of the antenna device to operate as a slot antenna. The characteristics of the loop antenna and the slot antenna complement each other in the loop antenna mode and the slot antenna mode, and it is possible to obtain an antenna gain greater than with only a loop antenna.

Figure 6:
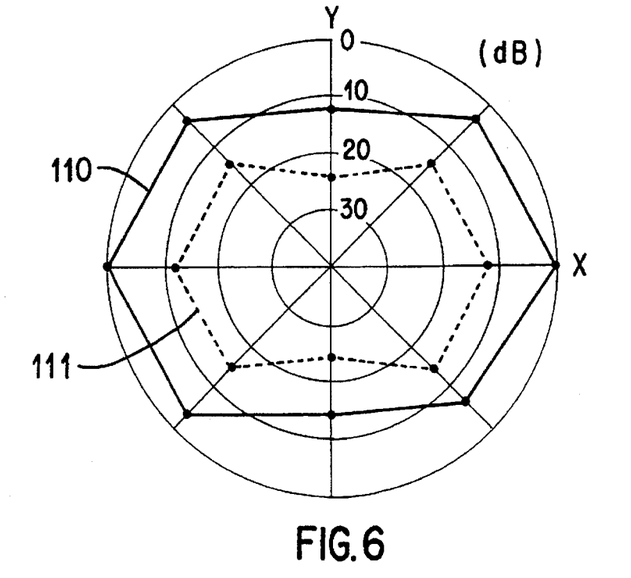
FIG. 6 is a graph illustrating generally the antenna radiation directionality characteristics of antenna devices of the present invention and the related art.

Examples of antenna radiation directivity pattern measurements in the related art and the present invention are shown in FIG. 6. Vertically polarized wave components in the X-Y plane are shown in FIG. 6, and are normalized by a maximum antenna gain. The solid line 110 indicates the measurement results of the present invention, and the dotted line 111 indicates the measurement results of the related art. Conditions, such as the dimensions of the antenna or the frequency, are the same. The following features can be seen in FIG. 6. The direction of the X axis where the capacitance element is loaded is a maximum radiation direction in each case of the present invention and the related art. The antenna gain in the present invention is greater than that in the related art. Also, an approximately round radiation pattern is formed as a whole, and the antenna characteristics are improved as a result of the combination of the slot antenna with a conventional loop antenna.

The capacitance element loaded between the conductive plates is used to tune the antenna to a desired frequency by adjusting the capacitance value of the slot antenna. The position at which the capacitance element is electrically connected is preferably on the side opposite the short-circuit plate because the distribution of the electric current flowing through the conductive plate becomes more uniform, and the antenna characteristic is improved.

Figure 7A:
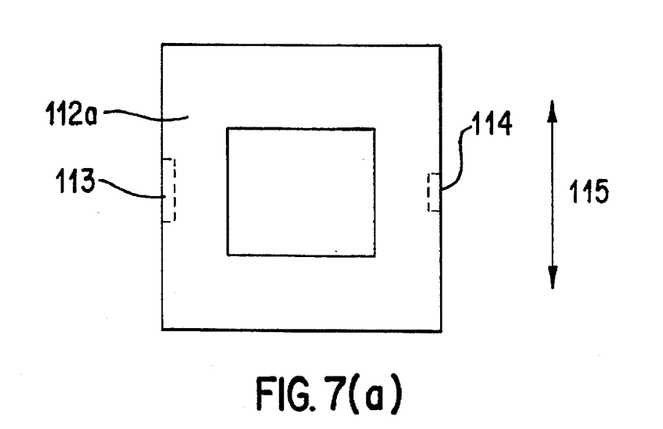
FIG. 7(a) is a plan view of an antenna device of the present invention.
Figure 7B:
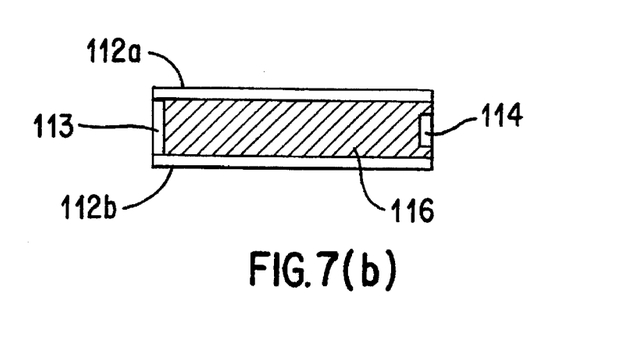
FIG. 7(b) is a side view of the antenna device, illustrating antenna characteristics based on the arrangement of a capacitance element.

The present invention obtains an increased antenna gain based on the arrangement of the capacitance element and the short-circuit plate as described above. The advantages thereof will now be explained. FIG. 7(a) is a plan view of an antenna device, and FIG. 7(b) is a side view thereof. The antenna device comprises two conductive plates 112a and 112b placed substantially parallel to each other, a short-circuit plate 113, and a capacitance element 114. The slot antenna is a magnetic-field detection type antenna. The magnetic-field components 115 in the case of vertically polarized wave are directed horizontally (in the direction of the Y axis). These magnetic-field components cause electric current of the same direction to flow through conductive plates 112a and 112b in the slot antenna mode and the loop antenna mode, and the electric currents are added to each other, making it possible to obtain a large antenna gain.

Figure 8A:
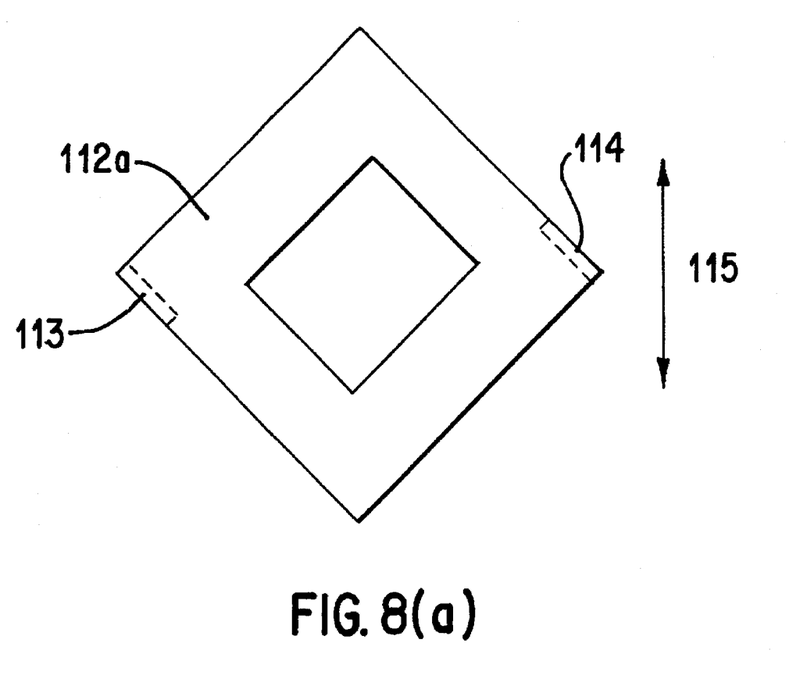
FIG. 8(a) is a plan view of an antenna device of the present invention.
Figure 8B:
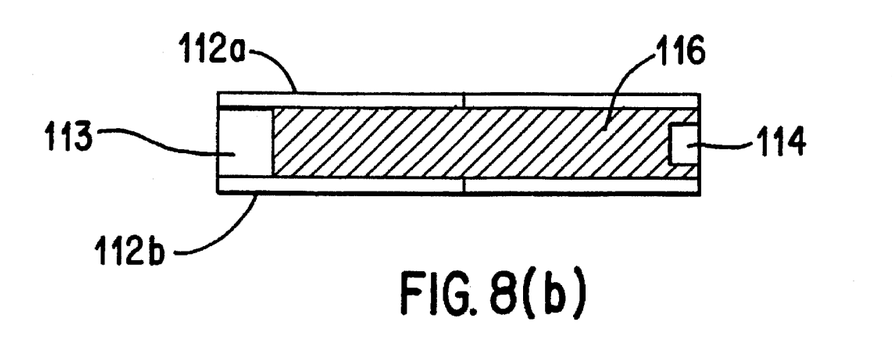
FIG. 8(b) is a side view of the antenna device, illustrating the operation of the present invention.

FIG. 8(a) is a plan view of an antenna device which has been improved further in accordance with the present invention. FIG. 8(b) is a side view thereof. Since the components in FIG. 8(a) and 8(b) are the same as those in FIGS. 7(a) and 7(b), the same reference numerals are given for corresponding components.

In the present invention, since a short-circuit plate 113 and a capacitance element 114 are placed at or near diagonally opposite positions of the conductive plates 112a and 112b of rectangular shape, the aperture area 116 (the shaded portion) in the loop portion is used to the fullest. Since the greater the aperture area of the loop antenna and the slot antenna, the greater the antenna gain of the loop antenna, the characteristics of the loop antenna and the slot antenna are improved, and therefore an even greater antenna gain can be obtained though the dimensions of the antenna are the same. Regarding the advantages in the more appropriate construction of the antenna device shown in FIG. 8, there is an improvement in the antenna gain of up to about 3 dB in comparison with the example of FIG. 7.

DESCRIPTION OF THE PREFERRED EMBODIMENTS

First Embodiment

Figure 1:
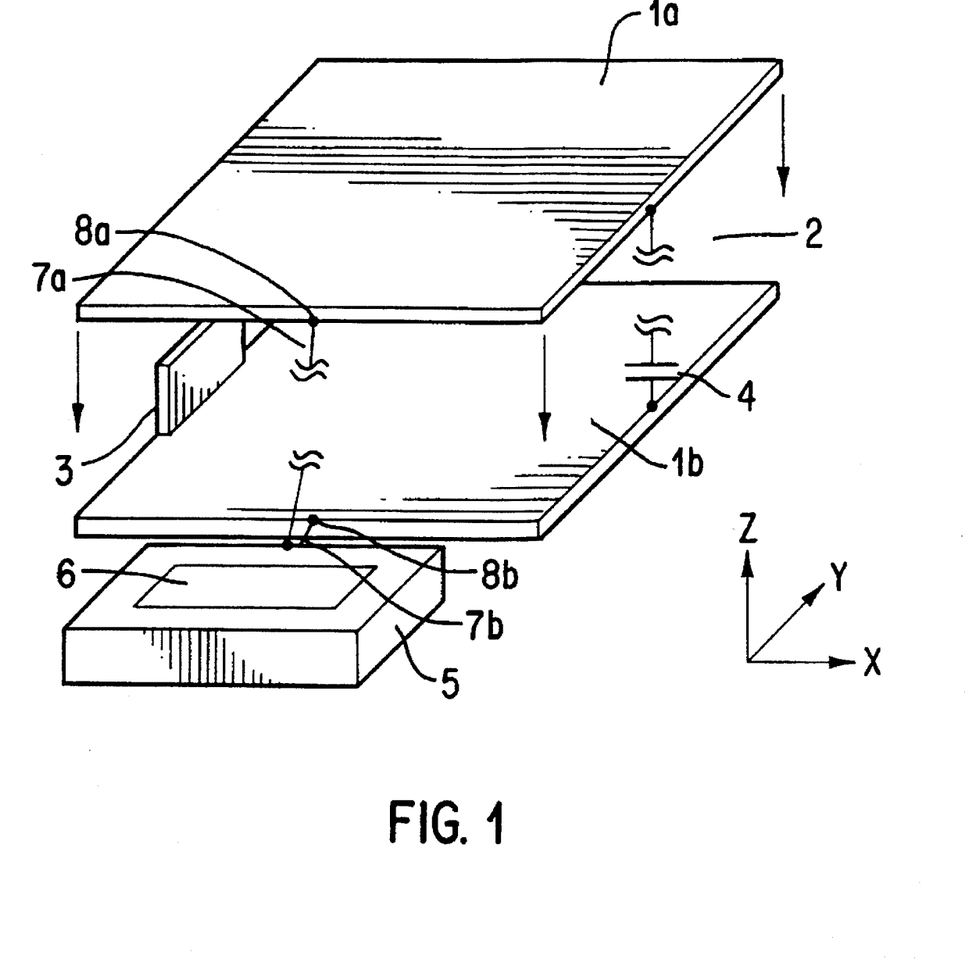
FIG. 1 is a schematic perspective view illustrating a first embodiment of a portable wireless apparatus employing an antenna device of the present invention.

Preferred embodiments of portable wireless apparatuses and antenna devices for use with portable wireless apparatuses in accordance with the present invention will be described below in detail with reference to the accompanying drawings.
First Embodiment FIG. 1 is a schematic perspective view of a portable wireless apparatus in accordance with a first embodiment of the present invention. Two conductive plates 1a and 1b are placed substantially parallel to each other with a gap 2 provided in between. The materials of the conductive plates 1a and 1b are copper, stainless steel, etc. If the conductive plates 1a and 1b are made of copper, it is possible to obtain a relatively large antenna gain because the conductive plates 1a and 1b have a small electrical resistance, and if the conductive plates 1a and 1b are made of stainless steel, they have excellent resistance to rust and high durability. Also, if there is no electrical influence, the outer side of the conductive plates 1a and 1b and the outer side of the circuit device of the wireless apparatus may be coated with a plastic material or the like in order to improve the attractiveness of the exterior. Although the conductive plates 1a and 1b are depicted spaced from each other in FIG. 1 for the sake of description, in practice, they are connected to each other by a short-circuit plate 3 at one end of the conductive plates. Other devices such as a setscrew, may be used in place of the short-circuit plate 3 if the conductive plates 1a and 1b can electrically conduct instead of the short-circuit plate 3 being formed integrally with the conductive plates 1a and 1b. With such a construction, a slot section is formed in the periphery on the side of conductive plates 1a and 1b of the antenna device.

A capacitance element 4 loaded in an end portion of the conductive plates 1a and 1b and on the opposite side of the short-circuit plate 3 is used to tune to a desired frequency, and may be a fixed capacitor or a variable capacitor so as to make fine adjustments possible, and further may be a varactor diode in order to provide for electronic tuning. A circuit device 5 of the wireless apparatus is connected to each of the conductive plates 1a and 1b at feed points 8a and 8b via feed lines 7a and 7b. When the feed points 8a and 8b are at the same position that the capacitance element 4 is loaded, since this antenna device does not work as a slot antenna and works only as a loop antenna, the antenna gain will be decreased. Therefore, by appropriately shifting the position of the feed points 8a and 8b from the position at which the capacitance element 4 is loaded on the conductive plates 1a and 1b as described in this embodiment, the antenna device can be made to reliably work as a slot antenna. Also, since the feed impedance of the conductive plates 1a and 1b varies depending upon the position of the feed point, it is possible to adjust the position to perform impedance matching with the circuit device 5 of the wireless apparatus.

The circuit device 5 of the wireless apparatus comprises a display device 6, such as a liquid-crystal panel, for displaying information about the portable wireless apparatus. The circuit device 5 is placed outside the conductive plates 1a and 1b and in parallel to the two conductive plates, and there is no conductive matter that blocks the section between the conductive plates 1a and 1b at all, which is very advantageous, and a large antenna gain can be obtained.

Figure 2:
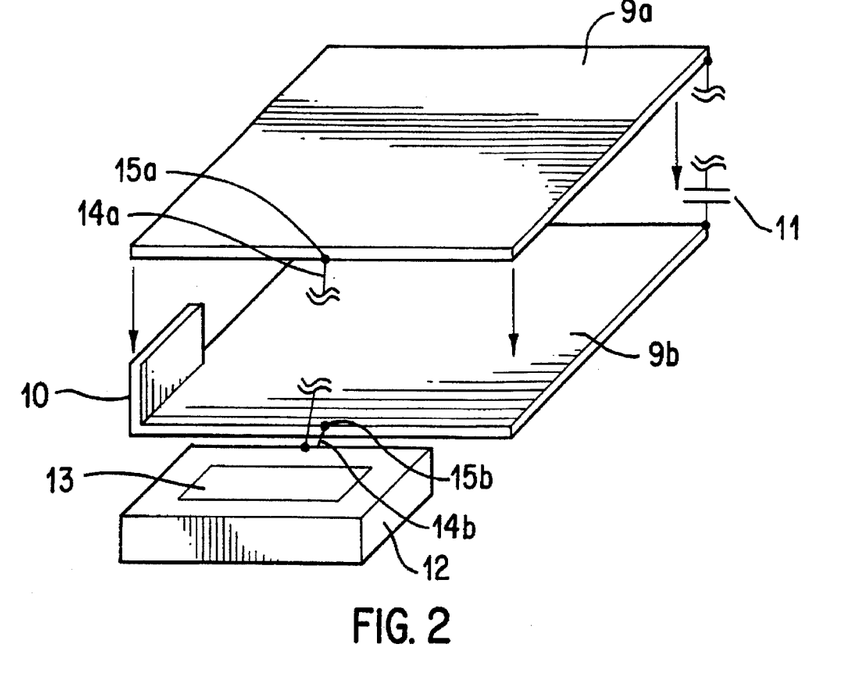
FIG. 2 is a schematic perspective view illustrating a second embodiment of a portable wireless apparatus employing an antenna device of the present invention.

In the present invention, a slot antenna mode and a loop antenna mode are used in which a magnetic-field detection type antenna is used in each mode. Since the electromagnetic field distribution near a human body tends to include large magnetic-field components and small electric-field components, when the portable wireless apparatus of the present invention is fitted on the human body or the clothing while it is being carried, the antenna characteristics are improved, and particularly the sensitivity of the wireless apparatus is improved.
Second Embodiment FIG. 2 is a schematic perspective view of a portable wireless apparatus in accordance with a second embodiment of the present invention. A short-circuit plate 10 connects two rectangular conductive plates 9a and 9b, and a capacitance element 11 for tuning connected between the conductive plates 9a and 9b is positioned on the opposite side of the short-circuit plate 10 at or near the diagonally opposite position on the conductive plates 9a and 9b. Based on such a positional arrangement of the short-circuit plate 10 and the capacitance element 11, a maximum aperture area in the loop portion on the side can be secured, and the characteristics of the antenna can be improved. A maximum of antenna gain can be obtained without increasing the dimensions of the antenna. Also, if electrical influence can be avoided, the outer side of the conductive plates 9a and 9b and the outer side of a circuit device 12 of the wireless apparatus may be coated with a plastic material or the like in order to improve the attractiveness of the exterior.

The circuit device 12 of the wireless apparatus is connected to each of the conductive plates 9a and 9b at the feed points 15a and 15b via feed lines 14a and 14b, respectively. In this embodiment also, the feed points 15a and 15b on the two conductive plates 9a and 9b are shifted from the position at which the capacitance element 11 is loaded. The circuit device 12 of the wireless apparatus comprises a display device 13, such as a liquid-crystal panel, for displaying information about the portable wireless apparatus. The circuit device 12 is placed outside the conductive plates 9a and 9b and in parallel to the two conductive plates. Since there is no electroconductive matter which blocks the section between the conductive plates 9a and 9b at all, an even greater antenna gain can be obtained.

Third Embodiment

Figure 3:
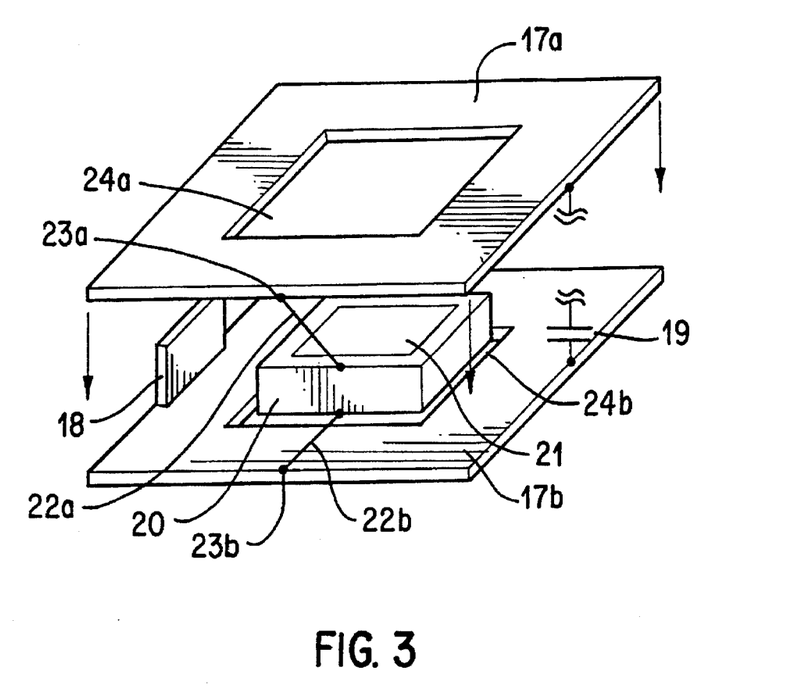
FIG. 3 is a schematic perspective view illustrating a third embodiment of a portable wireless apparatus employing an antenna device of the present invention.

FIG. 3 is a schematic perspective view of a portable wireless apparatus in accordance with a third embodiment of the present invention. Two conductive plates 17a and 17b are placed substantially parallel to each other with a gap in between. Although in FIG. 3 the conductive plates 17a and 17b are depicted spaced from each other for the sake of description, in practice, these plates are connected to each other at the end portions thereof by a short-circuit plate 18. Also, if electrical influence can be avoided the outer side of the conductive plates 17a and 17b may be coated with a plastic material or the like in order to improve the attractiveness of the exterior. A capacitance element 19 loaded at one end portion of the conductive plates 17a and 17b and on the opposite side from the short-circuit plate 18 is used to tune to a desired frequency the capacitance element may be a ceramic capacitor or the like.

A circuit device 20 of the wireless apparatus is connected to each of the conductive plates 17a and 17b at the feed points 23a and 23b via feed lines 22a and 22b. Feed points 23a and 23b on the two conductive plates 17a and 17b are shifted from the position at which the capacitance element 19 is loaded.

The circuit device 20 of the wireless apparatus includes a display device 21, such as a liquid-crystal panel, and is formed between the conductive plates 17a and 17b. In such a construction, the space within the portable wireless apparatus, including the antenna device, can be effectively used, and thus the entire apparatus can be made compact. Aperture portions (hereinafter referred to as "windows") 24a and 24b are formed at a position of the conductive plates 17a and 17b overlapping the circuit of the wireless apparatus. The window 24a in the upper conductive plate 17a facilitates observation of the contents of the display of the display means 21 from outside, and the window 24b in the lower conductive plate 17b facilitates replacement of a battery (not shown) of the portable wireless apparatus. In the case of a construction in which the battery is replaced from the side, only the window 24a need to be provided without providing the window 24b. The provision of the windows 24a and 24b makes it possible to provide a large distance between the conductive plates 17a and 17b, and the circuit device 20 of the wireless apparatus so that the amount of noise which is generated from the circuit device 20 of the wireless apparatus and which enters the antenna is reduced, and satisfactory antenna characteristics can be obtained. Therefore, if these windows 24a and 24b are provided near, in particular, a local oscillator, a DC—DC converter, etc. in which excessive noise is likely to occur effective operation is achieved.

Fourth Embodiment

Figure 4A:
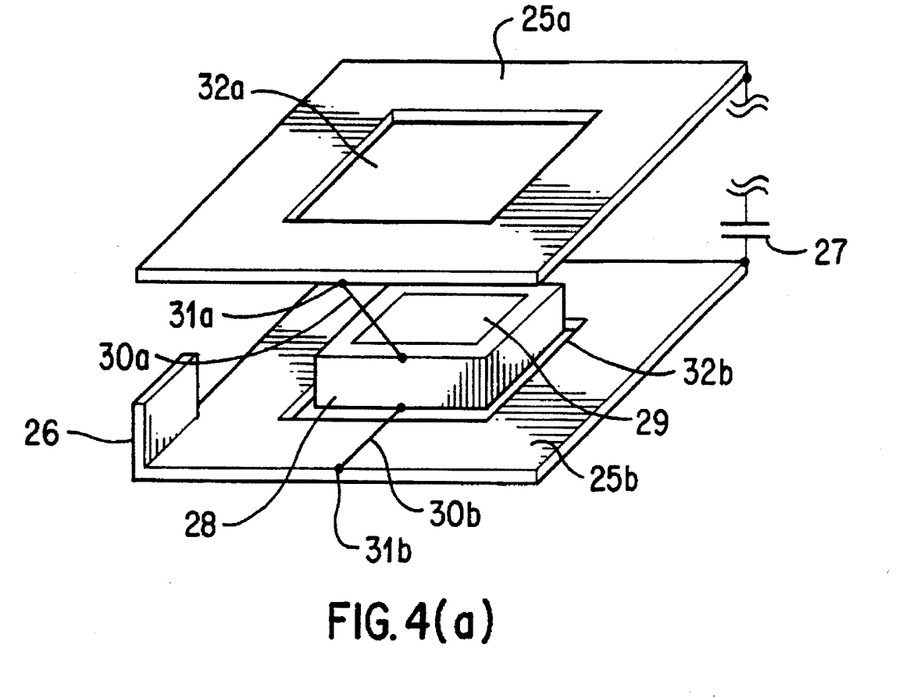
FIGS. 4(a) and 4(b) are schematic perspective views illustrating variations of a fourth embodiment of a portable wireless apparatus employing an antenna device of the present invention.

FIG. 4(a) is a schematic perspective view of a portable wireless apparatus in accordance with a fourth embodiment of the present invention. A capacitance element 27 loaded between two rectangular conductive plates 25a and 25b placed substantially parallel to each other is provided at or near a position diagonally opposite the position of a short-circuit plate 26 that joins rectangular conductive plates 25a and 25b. Based on such a positional arrangement of the short-circuit plate 26 and the capacitance element 27, a maximum aperture area in the loop portion is present, and the characteristics of the antenna can be improved. An even greater antenna gain can be obtained even though the dimensions of the antenna are the same. Feed lines 30a and 30b are connected to conductive plates 25a and 25b at feed points 31a and 31b, respectively. In this embodiment also, the positions of the feed points 31a and 31b are shifted from the position at which the capacitance element 27 is loaded. Also, if electrical influence can be avoided, the outer side of the conductive plates 25a and 25b and the outer side of a circuit device 12 of the wireless apparatus may be coated with a plastic material or the like in order to improve the attractiveness of the exterior.

A circuit device 28 of the wireless apparatus including a display device 29, such as a liquid-crystal panel, is placed between the conductive plates 25a and 25b. In such a construction, the space within the portable wireless apparatus, including the antenna device, can be effectively used, and thus the entire apparatus can be made compact.

Aperture portions (hereinafter referred to as "windows") 32a and 32b are formed in the central portion of the conductive plates 25a and 25b. The window 32a in upper conductive plate 25a facilitates observation of the display contents of the display device 29 from outside, and the lower conductive plate 25b facilitates the replacement of a battery (not shown) of the portable wireless apparatus. In the case of a construction in which the battery is replaced from the side, only the window 24a need be provided, without providing the window 24b. The provision of the windows 32a and 32b makes it possible to have a large distance between the conductive plates 25a and 25b and the circuit device 28 of the wireless apparatus, the amount of noise which is generated from the circuit device 28 of the wireless apparatus and which enters the antenna is reduced, and satisfactory antenna characteristics can be obtained.

Modification of the Fourth Embodiment

Figure 4B:
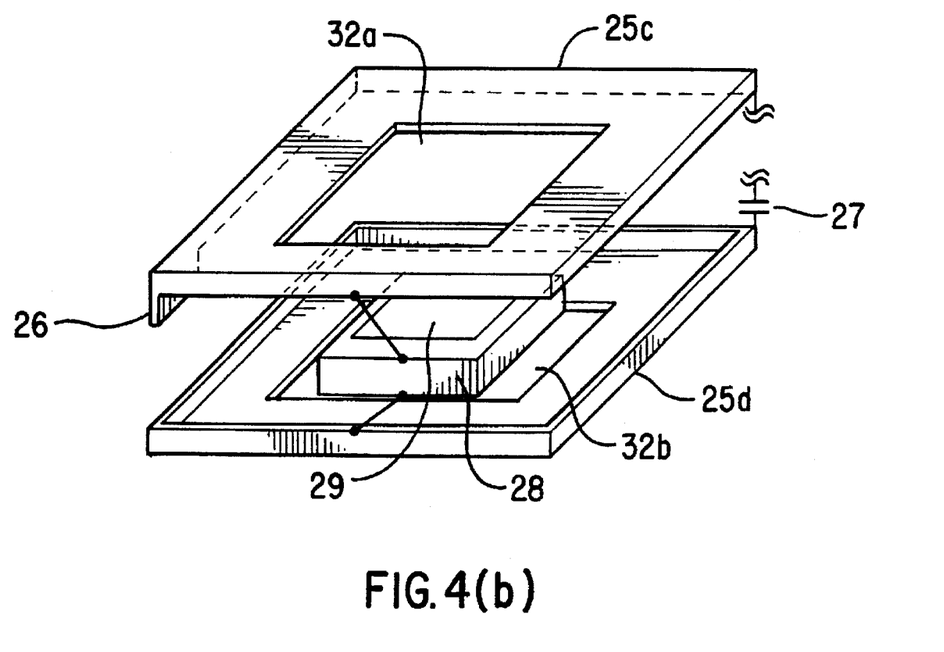

FIG. 4(b) is a schematic perspective view of a portable wireless apparatus illustrating a modification of the embodiment of FIG. 4(a). Capacitance elements 27 loaded between two rectangular conductive plates 25c and 25d placed substantially parallel to each other are each placed near the diagonal positions of the short-circuit plate 26 and the conductive plates 25c and 25d. A portion bent toward the other conductive plate is provided at the edges of the conductive plates 25c and 25d, and cutout portions (hereinafter referred to as "windows") 32a and 32b are formed in the central portion of the conductive plates 25c and 25d. The circuit device 28 of the wireless apparatus includes a display device 29, such as a liquid-crystal panel, that is placed between the conductive plates 25c and 25d, and the display contents of the display device 29 can be observed through the window 32a from outside.

In this embodiment, a slot antenna is formed by an edge portion around the two conductive plates 25c and 25d. In general, when the area of the conductive plate is relatively small in comparison with the wavelength of the frequency used, the antenna gain tends to decrease. Therefore, the greater the area of the conductive plate, the better. When a window is provided in the conductive plate, the area of the conductive plate decreases. However, by bending the edge portion of the conductive plate, it is possible to compensate for the decrease in the entire area of the conductive plate without changing the size of the entire apparatus, thus minimizing any decrease in the antenna gain. In particular, the present invention is effective for use in an ultra-small wristwatch type portable wireless apparatus, where the area of a conductive plate is greatly limited.

In such a construction, the space of the portable wireless apparatus, including the antenna device, can be effectively used, the entire apparatus can be made compact, and satisfactory antenna characteristics can be obtained.

Portable Wireless Apparatus

Figure 5:
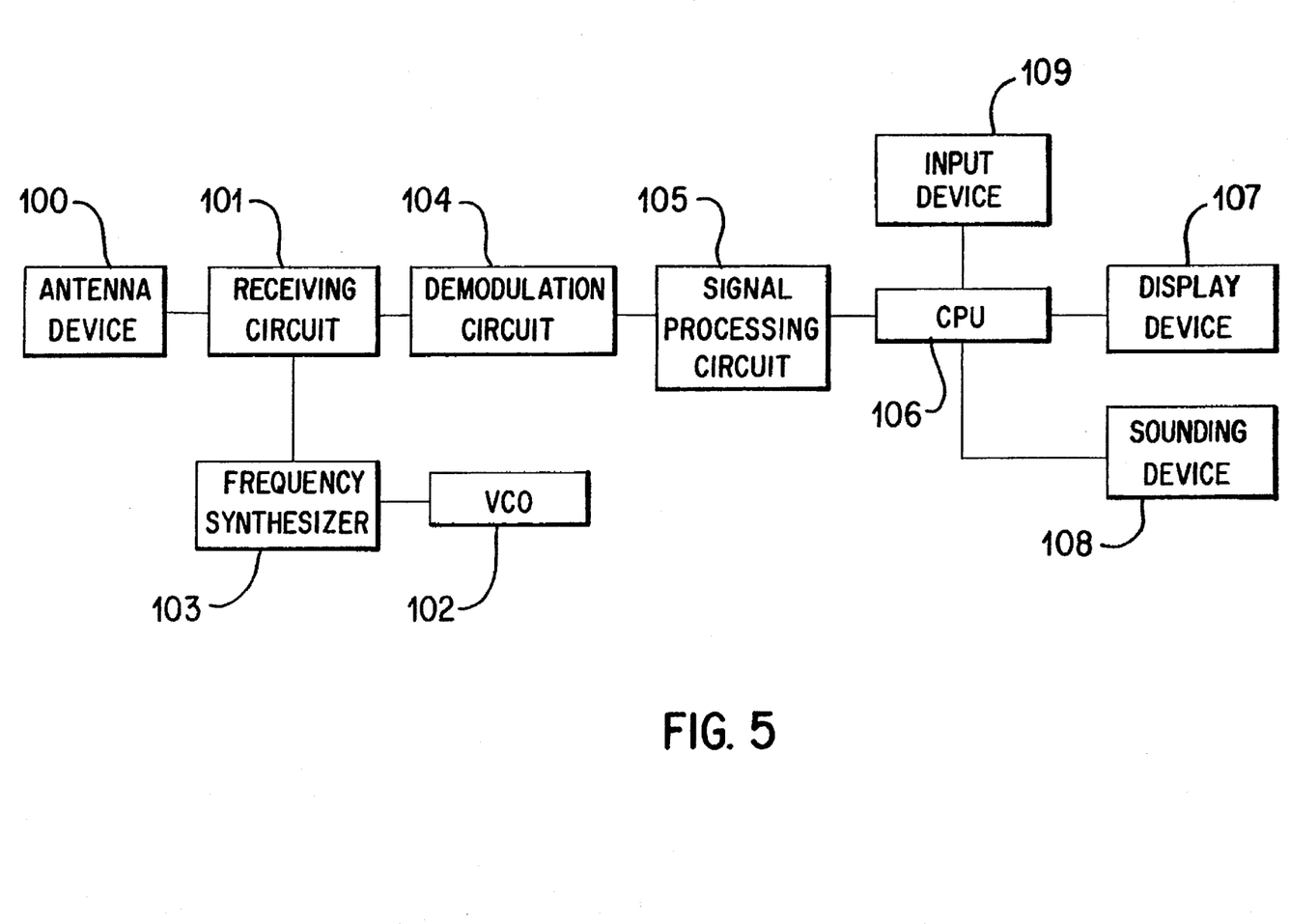
FIG. 5 is a block diagram illustrating of a portable wireless system of the present invention.

FIG. 5 illustrates details of an example of a portable wireless apparatus of the present invention. An antenna device 100 is connected to a receiving circuit 101 including an antenna matching circuit. Signals from a VCO (voltage-controlled oscillator) 102 are provided to the receiving circuit 101 via a frequency synthesizer 103. The signals which are amplified and filtered by the receiving circuit 101 are demodulated by a demodulation circuit 104, are decoded by a signal processing circuit 105, and enters a CPU 106. The CPU 106 drives a display device 107, such as a liquid-crystal panel, and a sounding device 108, such as a piezoelectric element or an electromagnetic buzzer, in response to these signals. There is also a case in which voice signals are made to flow through a speaker. The CPU 106 is also connected to an input device 109, such as a switch. Power to these components is supplied from a built-in battery.

Although in this example the portable wireless apparatus has the function of receiving signals, of course, even if it has a signal transmission/reception function or only the signal transmission function, the advantages of the antenna device and the portable wireless apparatus employing the antenna device of the present invention are the same.

As has been described above, in the antenna device and the portable wireless apparatus employing the antenna device, since the positions of feed points of two conductive plates are shifted from the position at which a capacitance element for tuning is loaded, it is possible to make this antenna device reliably work as a slot antenna, and to obtain an antenna gain greater than that of a conventional loop antenna. By moving the positions of the feed points, it is possible to adjust the feed impedance to match the impedance of the circuit device of the wireless apparatus to that of the antenna section.

As a result of the arrangement of a short-circuit plate and capacitance elements at or near diagonally opposite positions of a rectangular conductive plate, an even greater antenna gain can be obtained by using a loop antenna mode to its fullest without enlarging the dimensions of the portable wireless apparatus. Both slot antennas and loop antennas are magnetic-field detection type antennas, and large magnetic-field components are associated with the electromagnetic field distribution near the human body. As a result, the sensitivity of the wireless apparatus is improved, and these antennas are suitable as antenna devices for portable wireless apparatuses used near the human body.

In addition, since a circuit device of a wireless apparatus is formed between two conductive plates, and a cutout portion (window) is provided in the conductive plate, it is possible to decrease the electrical influence of electrical noise or the like from the circuit device of the wireless apparatus, and it becomes possible to form a small portable wireless apparatus using the space of the main body of the portable wireless apparatus without harming the antenna characteristics.

While this invention has been described in conjunction with specific embodiments thereof, it is evident that many alternatives, modifications and variations will be apparent to those skilled in the art. Accordingly, preferred embodiments of the invention as set forth herein are intended to be illustrative, not limiting. Various changes may be made without departing from the spirit and scope of the invention as defined in the following claims.

What is claimed is:

1. An antenna device comprising:

two rectangular conductive plates placed substantially parallel to each other with a gap between said two rectangular conductive plates;

a short-circuit plate electrically connecting said rectangular conductive plates at first end portions of said rectangular conductive plates to short-circuit said rectangular conductive plates;

a capacitance element electrically connecting said rectangular conductive plates at second end portions of said rectangular conductive plates on a side of said rectangular conductive plates opposite to said first end portions; and electrical feed points of said rectangular conductive plates provided at portions of said rectangular conductive plates different from said second end portions, wherein said short-circuit plate and said capacitance element are located at approximately diagonally opposite corner positions of said rectangular conductive plates.

2. A portable wireless apparatus, comprising an antenna device, wherein the antenna device comprises:

two rectangular conductive plates placed substantially parallel to each other with a gap between said two rectangular conductive plates;

a short-circuit plate electrically connecting said rectangular conductive plates at first end portions of said rectangular conductive plates to short-circuit said rectangular conductive plates;

a capacitance element electrically connecting said rectangular conductive plates at second end portions of said rectangular conductive plates on a side of said rectangular conductive plates opposite to said first end portions; and electrical feed points of said rectangular conductive plates provided at portions of said rectangular conductive plates different from said second end portions, wherein said short-circuit plate and said capacitance element are located at approximately diagonally opposite corner positions of said rectangular conductive plates.

3. The portable wireless apparatus of claim 2, wherein said portable wireless apparatus includes a circuit device, and said circuit device is positioned in said gap.

4. A portable wireless apparatus having an antenna device, the antenna device comprising:

two conductive plates placed substantially parallel to each other with a gap between said two conductive plates;

a short-circuit plate electrically connecting said conductive plates at first end portions of said conductive plates to short-circuit said conductive plates;

a capacitance element electrically connecting said conductive plates at second end portions of said conductive plates on a side of said conductive plates opposite to said first end portions; and electrical feed points of said conductive plates provided at portions of said conductive plates different from said second end portions, wherein each of said conductive plates is rectangular, and said electrical connections of said short-circuit plate and said capacitance element to said conductive plates are located at or nearly at diagonally opposite positions of said conductive plates, said portable wireless apparatus including a circuit device, and said circuit device being positioned in said gap, an aperture being provided in at least one of said conductive plates, and said circuit device being aligned with said aperture in a direction perpendicular to the parallel direction of said conductive plates.

5. The portable wireless apparatus of claim 4, wherein a portion of an outer periphery of at least one of the two conductive plates is bent toward an other one of the two conductive plates.

6. An antenna device comprising:

conductive plate means for defining a gap of substantially uniform width over a substantial area, said conductive plate means including rectangular conductive plates on opposite sides of said gap;

short-circuit means for electrically connecting through a short-circuit said rectangular conductive plates, wherein the electrical connections are at first end portions of said conductive plate means;

capacitance means for electrically connecting and providing capacitance between said rectangular conductive plates at second end portions of said conductive plate means, wherein said short-circuit means and said capacitance means are located at approximately diagonally opposite corner positions of said rectangular conductive plates; and feed means for feeding electricity to said conductive plate means at portions of said conductive plate means different from said second end portions.

7. A portable wireless apparatus, comprising an antenna device, wherein the antenna device comprises:

conductive plate means for defining a gap of substantially uniform width over a substantial area, said conductive plate means including rectangular conductive plates on opposite sides of said gap;

short-circuit means for electrically connecting through a short-circuit said rectangular conductive plates, wherein the electrical connections are at first end portions of said conductive plate means;

capacitance means for electrically connecting and providing capacitance between said rectangular conductive plates at second end portions of said conductive plate means, wherein said short-circuit means and said capacitance means are located at approximately diagonally opposite corner positions of said rectangular conductive plates; and feed means for feeding electricity to said conductive plate means at portions of said conductive plate means different from said second end portions.

8. The portable wireless apparatus of claim 7, wherein said portable wireless apparatus includes circuit means, and said circuit means is positioned in said gap.

9. A portable wireless apparatus having an antenna device, the antenna device comprising:

conductive plate means for defining a gap of substantially uniform width over a substantial area, said conductive plate means including different portions on opposite sides of said gap;

short-circuit means for electrically connecting through a short-circuit said different portions, wherein the electrical connections are at first end portions of said conductive plate means;

capacitance means for electrically connecting and providing capacitance between said different portions at second end portions of said conductive plate means, wherein said first and second end portions are located on opposite sides of said area;

feed means for feeding electricity to said conductive plate means at portions of said conductive plate means different from said second end portions, said conductive plate means including rectangular conductive plates, and said electrical connections of said short-circuit means and said capacitance means being located at or nearly at diagonally opposite positions of said conductive plates, said portable wireless apparatus including circuit means, and said circuit means being positioned in said gap; and aperture means being provided in at least one of said conductive plates, and said circuit means being aligned with said aperture means in a direction perpendicular to the direction across said gap.

10. The portable wireless apparatus of claim 9, wherein a portion of an outer periphery of at least one of the different portions of the conductive plate means is bent toward an other one of the different portions of the conductive plate means.

11. A method of forming an antenna device, comprising:

placing two rectangular conductive plates substantially parallel to each other with a gap provided between said two rectangular conductive plates;

electrically connecting said rectangular conductive plates at first end portions of said rectangular conductive plates using a short-circuit plate to short-circuit said rectangular conductive plates;

electrically connecting said rectangular conductive plates with a capacitance connection at second end portions of said rectangular conductive plates, said short-circuit plate and said capacitance connection being located at approximately diagonally opposite corner positions of said rectangular conductive plates; and electrically connecting electrical feed points to said rectangular conductive plates at portions of said rectangular conductive plates different from said second end portions.

12. The method of claim 11, further comprising forming a portable wireless apparatus, wherein the portable wireless apparatus includes the antenna device.

13. The method of claim 12, further comprising the step of positioning a circuit device in said gap.

* * * * *